United States Patent [19]

Wotruba

[11] 4,144,526

[45] Mar. 13, 1979

[54] CIRCUIT ARRANGEMENT AND OPERATING PROCESS FOR CONVERTING AN ANALOGUE SIGNAL INTO A DIGITAL SIGNAL

[75] Inventor: Gottfried Wotruba, Munich, Fed. Rep. of Germany

[73] Assignee: Siemens Aktiengesellschaft, Berlin & Munich, Fed. Rep. of Germany

[21] Appl. No.: 761,005

[22] Filed: Jan. 21, 1977

[30] Foreign Application Priority Data

Jan. 22, 1976 [DE] Fed. Rep. of Germany ....... 2602315

[51] Int. Cl.² ........................................... H03K 13/02
[52] U.S. Cl. ............................................. 340/347 AD
[58] Field of Search ................ 340/347 AD, 347 MT, 340/347 M

[56] References Cited

U.S. PATENT DOCUMENTS

| | | | |
|---|---|---|---|
| 3,414,807 | 12/1968 | Evans | 340/347 NT |
| 3,903,543 | 9/1975 | Smith | 340/347 AD |
| 3,906,488 | 9/1975 | Suarez-Gartner | 340/347 AD |
| 4,070,667 | 1/1978 | Eichelberger | 340/347 AD |

OTHER PUBLICATIONS

Mok, "Solid State Electronics," 1974, vol. 17, pp. 1147–1154.

*Primary Examiner*—Charles D. Miller
*Attorney, Agent, or Firm*—Hill, Gross, Simpson, Van Santen, Steadman, Chiara & Simpson

[57] ABSTRACT

A circuit arrangement and process is provided for converting an analogue signal into a digital signal or converting a digital signal into an analogue signal. The circuit arrangement has first and second capacitances with a charge transfer device between the capacitances for providing a stepped exchange of charge therebetween. For analogue to digital conversion, a device is provided which brings the second capacitance to a given charge state for each step exchange. An evaluation device evaluates the charge state of the second capacitance for each stepped exchange until the charge on the second capacitance is below a given level. A counting device counts each of the stepped exchanges of charge such that the total count provides the corresponding digital signal. For digital to analogue conversion, in one embodiment a charge is placed on the second capacitance. The charge transfer device then removes equal quantities of charge in a plurality of steps and transfers this charge to the first capacitance. The number of steps corresponds to the number of the digital signal. Finally, a read-out circuit detects the total charge transferred to the first capacitor and provides a corresponding analogue signal. The charge transfer device used for either analogue to digital or digital to analogue conversion preferably comprises a charge coupled device having electrodes over an insulating layer formed on a substrate.

6 Claims, 17 Drawing Figures

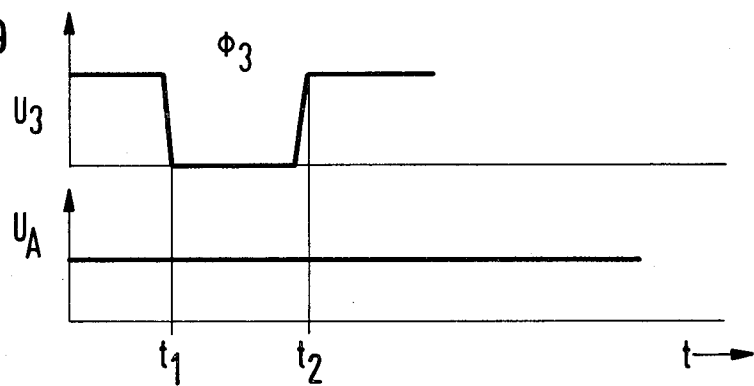
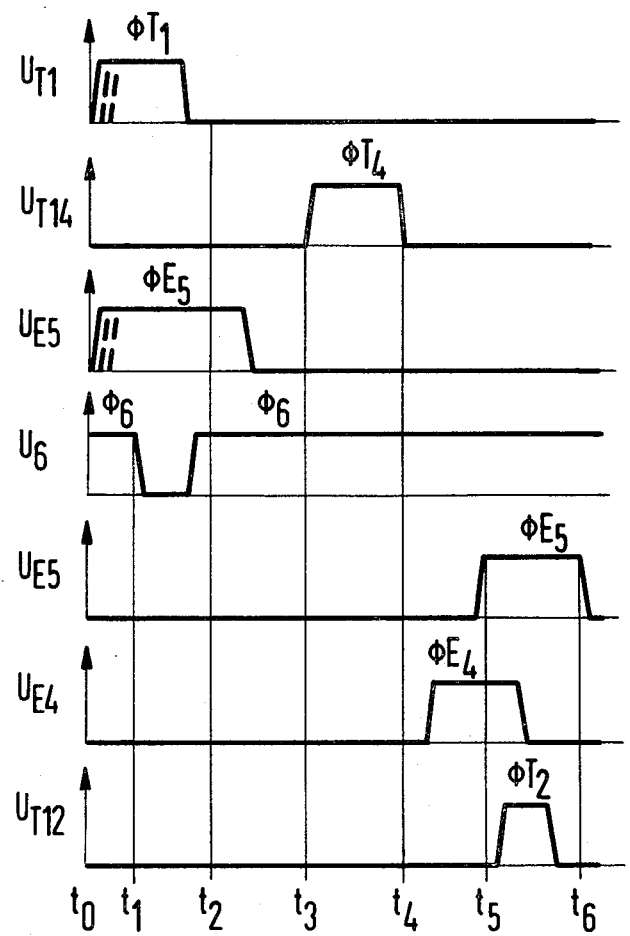

CIRCUIT ARRANGEMENT AND OPERATING PROCESS FOR CONVERTING AN ANALOGUE SIGNAL INTO A DIGITAL SIGNAL

BACKGROUND OF THE INVENTION

1. Field of the Invention

The invention relates to a circuit arrangement for converting an analogue signal expressed as a magnitude of an electric voltage $U_A$ into a digital signal and/or for converting a digital signal into an analogue signal, and further relates to a process for the operation of the circuit arrangement.

2. Description of the Prior Art

In measuring and regulating technology, analogue-digital converters (which in the following will also be abbreviated as ADC), are frequently required to facilitate a data-wise detection of an analogue signal, and a further processing of the signal with digital calculating systems. In addition, digital-analogue converters are required to obtain from a digital value an analogue signal with which a system can be regulated, for example. Such analogue-digital and digital-analogue converters should exhibit as high as possible a resolution such that the time required for the conversion may be as short as possible. Also the circuit arrangement for the converter should be capable of being constructed on a small area and on one single semiconductor chip.

In accordance with the prior art, various circuit arrangements are known for converting an analogue signal into a digital signal and vice versa. Thus, for example, the 1972 edition of "IEEE International Solid-State Circuits Conference," p. 146, describes a circuit arrangement with which an analogue signal can be converted into a digital signal in a very short length of time. The process on which this circuit arrangement is based consists in dividing a reference voltage for a N-bit converter into N-sub-voltages with the aid of a voltage divider and, with the aid of $(2^N-1)$ comparators, developing a decision as to which of these sub-voltages exceeds the input signal. A circuit arrangement suitable for this purpose thus requires, for example, for a 4-bit converter, 15 comparators, so that such circuit arrangements have a large space requirement and thus cannot be constructed on a small area on one semiconductor chip.

Another possibility of converting an analogue signal into a digital signal consists in altering the charge state of a capacitor with the analogue signal in the form of the value of an electric voltage $U_A$ and then, by a stepped recharging of this capacitor, determining the change in this charge state caused by the connection of the analogue signal. This can be effected on the one hand in that the analogue signal charges a capacitor, the capacitor is discharged in stepped fashion, and the number of individual discharge steps is counted, the digital signal corresponding to the analogue signal being formed by the number of counted discharge steps. Vice versa, it is also possible to partially discharge an already charged capacitor with the analogue signal $U_A$, and, in individual recharging steps either to return the capacitor to the earlier state or to entirely discharge it, and to count the individual recharging steps. Circuit arrangements of this type can, with slight circuitry modifications, also be operated as digital-analogue converters. For this purpose a fixed quantity of charge is transported into a capacitance (capacitor) with a frequency in accordance with the digital number. In this case the voltage appearing across this capacitance changes by a specific amount with each charging step so that the voltage appearing across this capacitance after the end of the recharging steps corresponds to the digital number.

An example of a circuit arrangement with which it is possible to carry out such a process for converting an analogue signal into a digital signal is described in "IEEE international Solid-State Circuits Conference" 1974, p. 194 et seq. The fundamental circuit diagram of this arrangement is illustrated in FIG. 1. It consists of a capacitor $C_1$ to which the analogue signal $U_A$ is connected via a first switch which, for example, can be a transistor $T_1$, whereby the capacitor $C_1$ becomes charged. When the transistor $T_1$ has opened, the capacitor $C_1$ is discharged in stepped fashion via a second switch which, for example, can be a transistor $T_4$. This is effected in that when the transistor $T_4$ is switched on, a portion of the charge of capacitor $C_1$ is fed into a second capacitor $C_2$ which has a substantially lower capacitance than the capacitor $C_1$. Due to the fact that charge flows from the capacitor $C_1$ to the initially uncharged capacitor $C_2$, the voltage across the capacitor $C_2$ increases. This rise in voltage is established by an evaluator circuit. The evaluator can, for example, be in the form of a transistor $T_3$ which is switched into the conductive state whenever the voltage occurring across the capacitor $C_2$ is greater than the start voltage of this transistor. When the capacitor $C_2$ has been charged, and an evaluator pulse has been emitted, the capacitor $C_2$ is brought back to the reference potential $U_{Ref}$ via a third switch, for example a transistor $T_2$. When the switch $T_2$ has opened, a new discharge step commences for the capacitor $C_1$ as a result of the opening of the switch $T_4$. These discharge steps are continued until the voltage occurring across the second capacitor $C_2$ following the recharging is no longer sufficient to actuate the transistor $T_3$ serving as an evaluator. The number of discharge steps required for this purpose is determined and is converted into the digital word. A circuit arrangement with which this process can be executed is shown in FIG. 1. This circuit arrangement, which is known from the prior art, is suitable for construction in integrated fashion with a small space requirement on one semiconductor chip. However, the operating process for this circuit arrangement has considerable disadvantages. These result on the one hand from the fact that in the stepped recharging from the capacitor $C_1$ to the capacitor $C_2$, a constant, fixed quantity of charge is not transported into the capacitor $C_2$ on each occasion, but rather the quantity of charge transported into the capacitor $C_2$ in an individual recharging step falls constantly with an increasing number of recharging steps. This is due to the fact that the quantity of charge flowing into the capacitor $C_2$ is dependent upon the potential difference between the voltage in each case connected to the capacitor $C_1$ and the reference voltage. This voltage difference reduces with increasing discharge of the capacitor $C_1$. It is particularly disadvantageous that no linear relationship exists between the number of discharge steps and the value of the analogue signal $U_A$. A further disadvantage consists in that the resolution of this circuit arrangement is dependent upon the ratio of the capacitances of the capacitor $C_1$ and of the capacitor $C_2$. For a very high resolution the capacitor $C_2$ would have to be very much smaller than the capacitor $C_1$; however, the value of capacitor $C_2$ is governed by a lower limit since the capacitance of the capacitor $C_2$ must be greater than the disruptive parasitic conductor path capacitances.

A further disadvantageous side effect consists in that further disruptive capacitances exist between the electrodes of the capacitor $C_1$ and the gate electrode of the transistor $T_4$ which serves as a switch; between the electrode of the capacitor $C_2$ and the gate electrode of the transistor $T_4$; and between the electrode of capacitor $C_2$ and the gate electrode of the transistor $T_2$ which switches the reference voltage. These parasitic capacitances cause a further inaccuracy in the conversion of the analogue signal into a digital signal since these disruptive capacitances must also be recharged during the recharging of the capacitor $C_1$ or capacitor $C_2$. The same difficulties occur when this arrangement is operated as a digital-analogue converter.

SUMMARY OF THE INVENTION

An object of the invention is to convert an analogue signal represented by the value of an electric voltage $U_A$ into a digital signal and/or for converting a digital signal into an analogue signal whereby steps are taken to insure that with every individual recharging step, the recharging is in each case carried out with a fixed quantity of charge which is independent of the charge state of the capacitor $C_1$.

Known charge transfer devices include bucket brigade devices (compare "Philips Techn Rundschau" volume 31, p. 97 et seq) and charge-coupled elements (Siemens Forschungs- und Entwicklungsberichte volume 4, (1975) p. 226 et seq.). The use of a charge transfer device (CTD) for recharging has the advantage over the prior art that the quantity of charge transported by a charge transfer device is constant and independent of the charge state of the capacitor from which the charge is taken and into which the charge is transported.

In accordance with a preferred embodiment of the invention, a charge-coupled element (CCD) is used as a charge transfer device. This has the advantage that the quantity of charge transported from the charge-coupled element can be kept very small so that in this way the resolution of the analogue-digital converter is considerably increased.

A charge-coupled element which is known per se and which is suitable for the circuit arrangement of the invention and can be constructed on a small area consists, for example, of a semiconductor substrate of a first conductivity type on which an insulating layer is arranged, and in which a series of several electrodes is arranged on the insulating layer. The semiconductor substrate is provided with an electrical terminal and doped in such manner that when a voltage $U_E$ which is greater than a start voltage $U_{T_o}$ is connected to one of the electrodes, the conductivity type in a zone of the semiconductor substrate lying beneath this electrode is inverted. A quantity of charge can be stored in an inverted zone of this type. By applying shift timing pulses to the electrodes in known manner ("RCA Rev" volume 34, p. 164 et seq), the quantity of charge located beneath an electrode can be displaced to a zone of the semiconductor substrate lying beneath another electrode. In this embodiment a zone doped oppositely to the semiconductor substrate is, in each case, arranged laterally at both ends of a row of electrodes in order to introduce and withdraw charge carriers into and out of the semiconductor substrate. These zones are arranged in such manner that they touch the inversion zones which are formed beneath end electrodes when a voltage $U_E > U_{T_o}$ is connected to the end electrodes. In this way a charge supply from the exterior into such an inversion zone is facilitated. The first electrode $E_1$ can be considered together with the first doped zone as an "input transistor" of the CCD via which charges reach the semiconductor substrate.

Since the function of the charge-coupled element (CCD) consists in always withdrawing the same quantity of charge from the first capacitance and transporting this to the second capacitance, both two-phase and multi-phase CCDs can be used for the circuit arrangement of the invention.

Since a charge-coupled element (CCD) can be considered as a series of closely adjacent MIS capacitors, in accordance with a preferred further development of the invention it is advisable to likewise form the first capacitance as an MIS capacitor in which case this capacitor is constructed together with the CCD in the same semiconductor substrate. A known MIS capacitor of this type consists of a semiconductor substrate, an insulating layer applied on the substrate, and an electrode arranged on the insulating layer consisting of conductive material e.g. a metal layer. When a voltage is applied between this electrode and the semiconductor substrate, an inversion layer in which charge carriers are stored is formed in the vicinity of the surface of the semiconductor substrate.

A circuit arrangement constructed with such a MIS-capacitor is further designed in such manner that the metal electrode of the MIS-capacitor is located in series with the electrodes of the charge-coupled element on the insulating layer provided for charge shift. The metal electrode of this MIS-capacitor is arranged sufficiently close to one of these electrodes of the CCD. Therefore, the particular inversion zone which forms beneath this electrode in the semiconductor substrate due to a pulse train voltage on the electrode comes into contact with the inversion zone located beneath the metal electrode of the MIS-capacitor and is conductively connected thereto. This construction has the advantage that a quantity of charge can be taken from the MIS capacitor with the aid of the charge-coupled element; that the electrode of the charge-coupled element which is adjacent to the MIS-capacitor is supplied via a shift timing pulse with a voltage which is greater than a start voltage $U_{T_o}$; and that this provides an inversion zone into which charge flows from the MIS-capacitor. Further it is ensured that the number of recharging steps which are carried out to discharge the first capacitance is independent of the start voltage of the "input transistor" of the CCD and is also independent of the fluctuations in the potential wells formed in the semiconductor substrate beneath the electrodes of the CCD when the shift timing pulses are connected. This arrangement dispenses with the need for a special switch between the first capacitance and the charge-coupled element which would have to be provided in systems similar to the fundamental circuit diagram in FIG. 2.

Other preferred embodiments of the circuit arrangement of the invention have the advantage that the number of recharging steps which follow discharge of the first capacitance is no longer dependent upon the start voltage of the "input transistor" of the CCD, and that the influence of fluctuations in the value of the individual electrodes and of other components is reduced.

A switch which is connected at the end of the charge-coupled element to a second doped zone and which during the operation of the arrangement applies a pulsed reference potential to the second doped zone, is preferably in the form of a MIS transistor. This facilitates an integration with the charge-coupled element on a semiconductor chip and also permits small-area design of the circuit arrangement. Also this second doped zone through which the charge carriers are introduced to and withdrawn from the charge-coupled element is simultaneously both the source and drain electrode of this MIS-transistor.

When the arrangement is operated as an analogue-digital converter, the resolution is determined by the number of recharging steps required to bring the first capacitance back to a given charge state (e.g. discharged in full) after having been charged following the connection of the analogue-digital signal voltage. In accordance with the operating process for this circuit arrangement, the stepped discharge is discontinued as soon as the potential connected to the electrode of the first capacitance connected with the first doped zone reaches a value at which the "input transistor" of the CCD formed of the first doped zone and the first electrode $E_1$ blocks. As a result, in a following recharging step, the quantity of charge transported into the second capacitance is no longer sufficient to trigger an evaluator pulse. To permit the recharging to be carried out sufficiently frequently before this "input transistor" blocks and the resolving power of the circuit arrangement becomes high, the second capacitance must be kept very small.

This design criterion is taken into consideration by a preferred embodiment of the invention in which the second capacitance is formed from the very small parasitic capacitances which are formed by the substrate line and the second doped zone together with the supply lines connected to this second doped zone.

When the circuit arrangement is operated as a digital-analogue converter, the resulting analogue signal occurs as a charging voltage of the first capacitance. In the event of a further evaluation of this analogue signal, the first capacitance must be connected, for example via a transistor, to peripheral switching elements. To avoid such a wiring now giving rise to a non-linear transmission of the analogue voltage connected to the first capacitance outwards to the peripheral switching elements, the first capacitance is connected to a read-out circuit in a preferred embodiment of the invention.

BRIEF DESCRIPTION OF THE DRAWINGS

FIGS. 6 to 12 show other embodiments of the circuit arrangement in accordance with the invention with associated illustrations of the potentials which occur during the operation of the arrangement as an analogue-digital converter in a recharging step, and of the timing pulses connected to the electrodes of the circuit arrangement;

DESCRIPTION OF THE PREFERRED EMBODIMENTS

Figure 1:
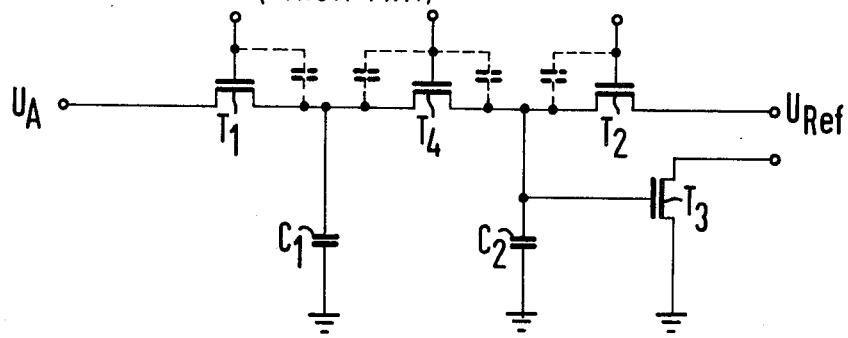
FIG. 1 is a fundamental circuit diagram of an analogue-digital converter of the prior art.
Figure 2:
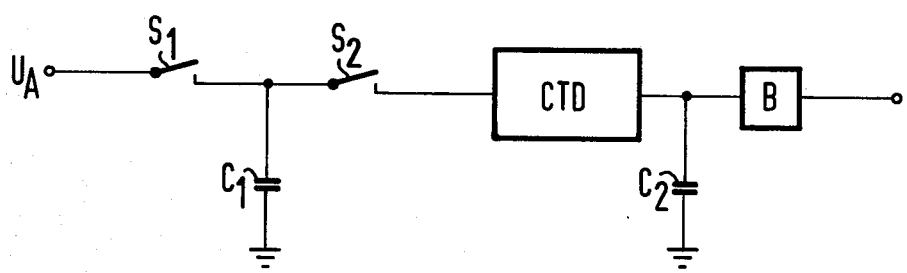
FIG. 2 is a fundamental circuit diagram of the arrangement of the invention.

The fundamental operating process for a circuit arrangement in accordance with the invention which is employed as an analogue-digital converter can be explained with reference to FIG. 2. The analogue voltage $U_A$ is connected via the switch $S_1$ to the capacitor $C_1$, where a quantity of charge $Q_A$ which is dependent upon the value of the analogue signal $U_A$, flows into the capacitor $C_1$ and charges the latter to a voltage $U_{CO}$. When the switch $S_1$ has opened and the switch $S_2$ has closed, the capacitor $C_1$ will be discharged in the following manner. With the aid of the charge shift circuit (CTD) (e.g. a charge coupled element (CCD)) in each period of the charge transfer pulse trains a constant quantity of charge $\Delta Q$ is withdrawn from the capacitor $C_1$ and transported to the second capacitance $C_2$. The periodic stepped discharge is terminated when the voltage $U_{C1}$ applied to the capacitor $C_1$ drops below a threshold value. The CCD-input is thus blocked. The quantity of charge transported to the second capacitance $C_2$ in the last recharging step is no longer sufficient to produce in this second capacitance a sufficiently high potential difference to trigger a counting pulse in the evaluator circuit B. The analogue signal, represented by the analogue voltage $U_A$ and by the charge $Q_A$ contained in the first capacitance, is converted into digital form with a number $N = Q_A/\Delta Q$ according to the stepped recharging process, where N designates the number of obtained evaluator pulses. Accordingly, the number N can be made very large by making the quantity of charge transported from the charge-coupled element very small.

Figure 3:
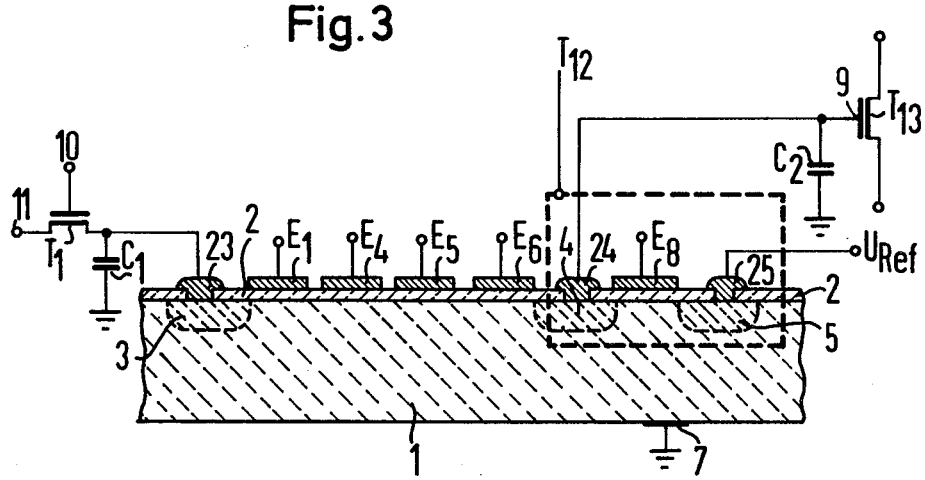
FIG. 3 shows a first preferred embodiment of the circuit arrangement in accordance with the invention.

FIG. 3 schematically illustrates one preferred embodiment of the circuit arrangement in accordance with the invention. Here the charge-coupled element is constructed on a silicon semiconductor body. It consists of a p-conducting substrate 1 in which three n-conducting doped zones 3, 4 and 5 are arranged. The substrate is doped e.g. with boron at a dopant concentration of between $5 \times 10^{14}$ and $5 \times 10^{15}/cm^3$. The n-conducting zones are doped e.g. with phosphorus at a concentration of approximately $10^{19}/cm^3$. These doped zones are provided with metal contacts 23, 24 and 25. Arranged on the semiconductor body is an insulating layer 2 consisting of $SiO_2$ upon which a series of metal-electrodes $E_1$, $E_4$, $E_5$ and $E_6$ is arranged. These metal electrodes are spaced approximately 2 $\mu m$ from one another. The thickness of the oxide layer amounts to approximately 0.08–0.1$\mu m$. In addition to these electrodes, which form the electrodes of the charge-coupled element, a further metal electrode $E_8$ which is the gate electrode of a field effect transistor $T_{12}$ is arranged on the insulating layer. Also a field effect transistor $T_{13}$ is constructed in the semiconductor substrate. The gate electrode of this transistor is referenced 9, the source electrode is referenced 18 and the drain electrode is referenced 19. In the embodiment illustrated in FIG. 3, the analogue signal $U_A$ connected to the electrode 11 of the transistor $T_1$ is connected via the transistor $T_1$ to the first capacitance $C_1$ whereby this capacitance is charged. The transistor $T_1$ is at the same time switched conductive by a timing pulse $\phi_A$. After the pulse train $\phi_A$ ceases the transistor $T_1$ is blocked and the capacitor $C_1$ is subsequently discharged in stepped fashion via the charge-coupled element, there being a decrease in the voltage $U_{C1}$ across this capacitor, since, in accordance with the doping conditions of the semiconductor body, negative charge carriers are taken from the capacitor $C_1$.

Figure 5:
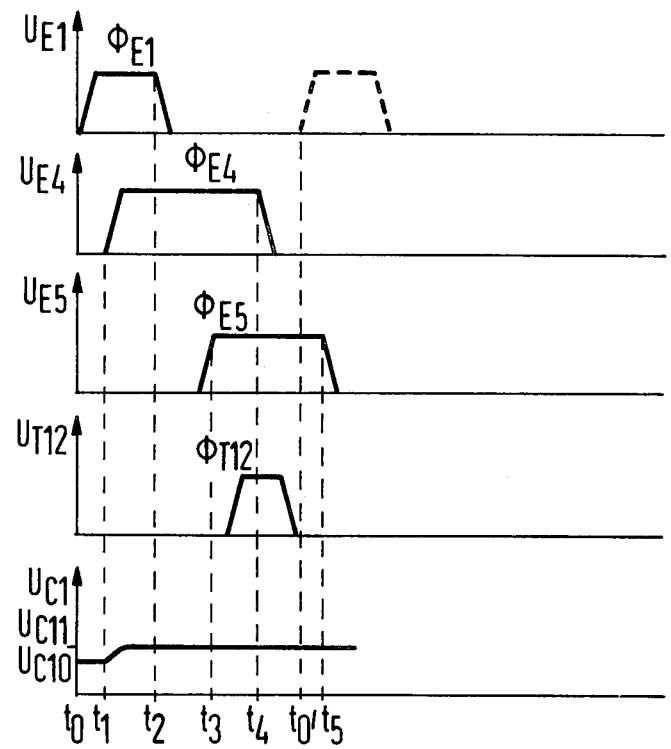

The program for the pulse train voltages which must be connected to the electrodes $E_1$ to $E_6$ of the charge-coupled element (CCD) for purposes of a charge transfer is schematically illustrated in FIG. 5. The amplitude of the pulse train voltages amounts to more than 3 V, preferably approximately 5 V.

Figure 4:
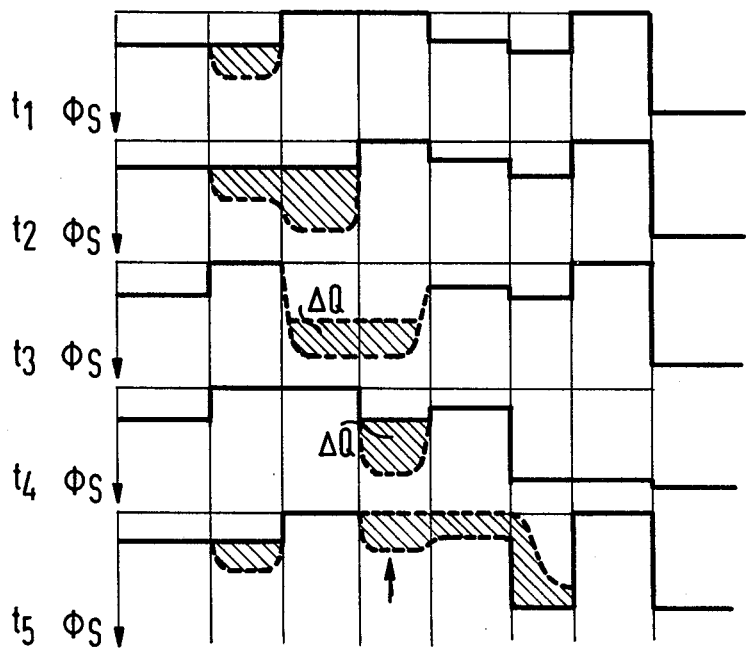
FIGS. 4 and 5 illustrate an operating process for the circuit arrangement shown in FIG. 3, FIG. 4 representing the potentials and charge quantities which occur in the semiconductor substrate during the execution of the charge shift at various times, and FIG. 5 illustrating which timing pulses are connected to the electrodes of the circuit arrangement for this operating process.

FIG. 4 schematically illustrates the changes produced in the semiconductor surface potential $\phi_S$ in known manner (e.g. in accordance with the "RCA Review" volume 34, p. 164 et seq.) by connecting the timing pulses to the electrodes of the CCD, and how the charge is transported from the input of the CCD to the output.

In the pulse train program (FIG. 5), the first discharge process is illustrated where the voltage $U_{C1}$ first rises from the start value $U_{C10}$ to the value $U_{C11} = U_C + \Delta Q \cdot 1/C_1$.

At the time $t_0$, the potential $U_{C10}$ is connected to the capacitor $C_1$ and the pulse train $\phi_{E1}$ with an amplitude $U_{E1}$ is applied to electrode E1. When $U_{E1} > U_{C10} + U_{T_0}$, where $U_{T_0}$ is the start voltage, an inversion zone is formed beneath the electrode $E_1$. The start voltage amounts to approximately 0.5-2 V. At a subsequent time $t_1$, the pulse train $\phi_{E4}$ is connected to the electrode $E_4$ and the potential well arising beneath the electrode $E_4$ is filled with the charge $\Delta Q$. This charge $\Delta Q$ flows from the first capacitance $C_1$ via the first doped zone 3 to the inversion zone beneath the electrode $E_1$ and from there into the potential well beneath $E_4$ where the voltage $U_{C1}$ across the capacitor rises to the value $U_{C11}$. When at the time $t_2$, the pulse train $\phi_{E1}$ is disconnected, the inversion layer beneath $E_1$ disappears and the charge $\Delta Q$ is transferred towards the right in the direction of the second doped zone 4 by known operating principles in CCDs (see "IEDM Conference" paper, No. 1974 p. 233-253). Specifically, the pulse train $\phi_{E5}$ is switched on at the time $t_3$ and the pulse train $\phi_{E4}$ is switched off at the time t4. When the transistor $T_{12}$ is switched conductive with a timing pulse $\phi_{T12}$, the second capacitance $C_2$, which is formed from the capacitance of the second doped zone 4, is simultaneously connected to a reference potential $U_{Ref}$ applied to the electrode 25 of the transistor $T_{12}$ and is thus precharged. The reference potential amounts to approximately 5 V. When the pulse train $\phi_{E5}$ is switched off at the time t5, the charge $\Delta Q$ then passes via the potential barrier which is produced as a result of the connection of a voltage $U_{E6}$ to the electrode $E_6$, to the second doped zone 4 and thus produces a voltage signal $U_{C2}$ across the second capacitance $C_2$. This voltage signal $U_{C2}$ is connected to the evaluator circuit. The evaluator circuit contains, for example, a transistor $T_{13}$ which is switched into the conductive state when the voltage signal connected to its gate electrode 9 exceeds the start voltage of this transistor $T_{13}$.

The process described in the time interval $t_0$ to $t_5$ is periodically repeated in accordance with the pulse train program illustrated in FIG. 5. The periodic discharge of the capacitor $C_1$ results in a rise in the voltage $U_{C1}$ to the value $U_{C1n}$ following the n-th discharge step. the CCD input formed from the first doped zone and the electrode $E_4$ blocks when the voltage becomes $U_{C1} > U_{E1} - U_{T_0}$ where $U_{T_0} = (U_{E1} - U_{C1n})$ designates the voltage difference at which an inversion layer no longer occurs when the pulse train $\phi_{E1}$ is switched on beneath the electrode $E_1$. Therefore, for an analogue signal which corresponds to a voltage $U_{C10}$ across the capacitor $C_1$ at the beginning of the conversion process, a number $$N = (1/\Delta Q) \cdot C_1 \cdot (U_{C10} - U_{E1} + U_{T_0})$$

of CCD output signals occurs at the CCD output.

Figure 6:
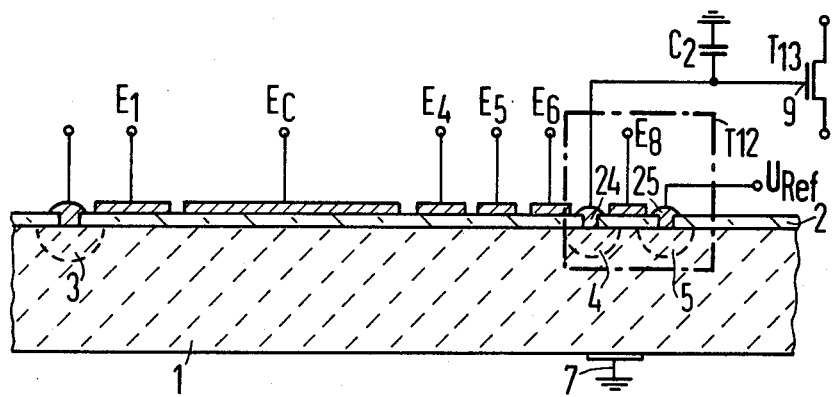

In the embodiment of the ADC illustrated in FIG. 6 and described below, the charge $Q_A$ corresponding to the analogue signal is stored in a MIS-capacitor beneath the electrode $E_c$. Here, as already described, the advantage is achieved that the termination for quantization of the charge $Q_A$ in $N = Q_A/\Delta Q$ steps is no longer dependent upon the start voltage of the "input transistor" of the CCD (electrode $E_1$ with doped zone 3 in FIG. 6). The function of the circuit is also independent of simultaneously occurring fluctuations in the depth of the potential wells beneath the electrodes $E_c$, $E_4$ and $E_5$. The error arising during the conversion is here determined exclusively by the small component tolerance of the adjacent electrodes $E_c$ and $E_4$. Therefore the number of quantizing steps N can be determined, for example, by just one adjustment of the potential of the voltage $U_{C1}$ connected to the electrode $E_c$ of the MIS-capacitor, and the amplitude of the pulse train $\phi_{E5}$. This constitutes an essential advantage, particularly in the construction of a plurality of ADCs on a semiconductor chip. The transistor $T_1$, via which the first capacitance is connected to the analogue signal $U_A$, is replaced in this embodiment by the first doped zone 3 and the electrode $E_1$ located between this zone and the MIS-capacitor electrode $E_c$ since these together can be considered as an "input transistor" of the CCD. The analogue signal $U_A$ is directly connected to the first doped zone 3 of the CCD. At the time $t_1$, the "input transistor" is switched conductive as a result of the connection of the pulse train $\phi_{E1}$ to the electrode $E_1$ and the potential well beneath the electrode $E_c$ is filled. The surface potential beneath the electrode $E_1$ here assumes the approximate value of $U_A$, whereas the depth of the potential well beneath $E_c$ corresponds to the d.c. voltage $U_c$ connected to this electrode. Thereafter the charge $Q_A(U_A)$ is transported in N steps to the second doped zone 4 via the CCD electrodes $E_4$, $E_5$, $E_6$ in the same manner as already explained with reference to the previous exemplary embodiment (FIG. 3-5).

Figure 7:
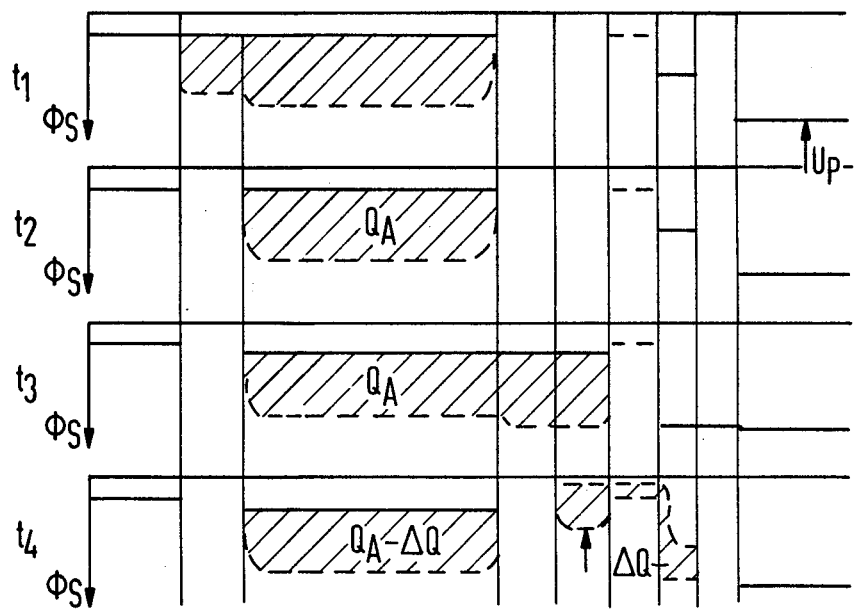
Figure 8:
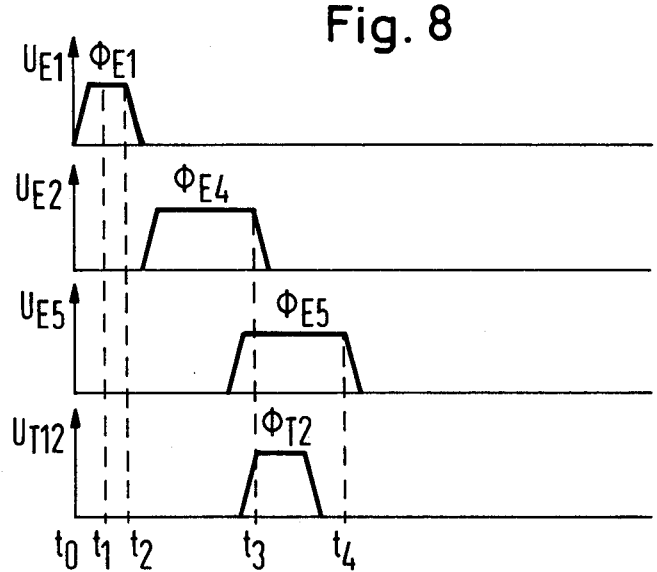

FIGS. 7 and 8 illustrate the first discharge step for the operating process in which the charge $Q_A$ is reduced to the amount $Q_A - \Delta Q$. This pulse train program is repeated periodically.

Alternatively, the charge $Q_A$ can also be input into the potential well located beneath the electrode $E_c$ with the operation depicted in FIG. 9 of the CCD-input. In this case, the analogue signal $U_A$ is connected to the electrode $E_1$ and a voltage $U_3$ is connected to the first doped zone 3. At time $t_1$, the voltage $U_3$ is disconnected in a pulse train $\phi_3$ and the potential well beneath $E_c$ is filled. At the following time $t_2$, at the end of the pulse train $\phi_3$, the voltage $U_3$ is switched on again, whereby the potential well beneath the electrode $E_5$ is again partially discharged.

Figure 10:
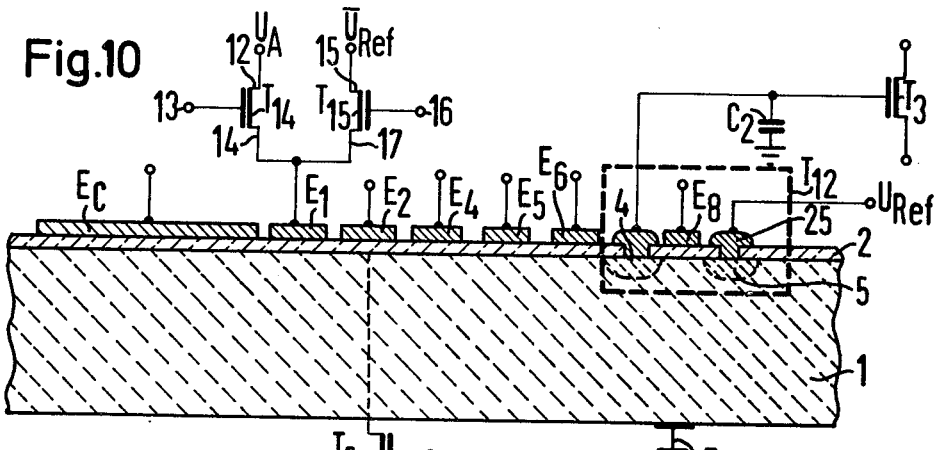

Another embodiment of the ADC in accordance with the invention reduces the influence of stray components on the function of the ADC. In this embodiment the correlation between the analogue signal $U_A$ and the charge $Q_A$ is largely linearized. This embodiment and the associated operating process will be explained in detail making reference to FIGS. 10, 11 and 12.

Figure 11:
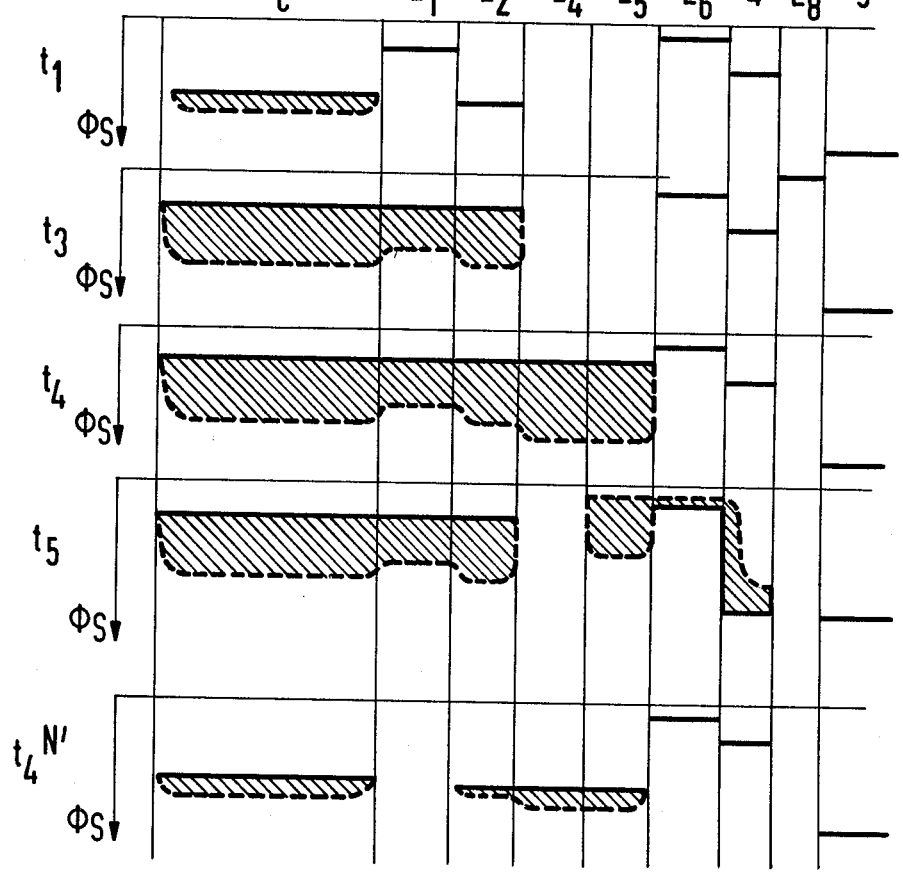
Figure 14:
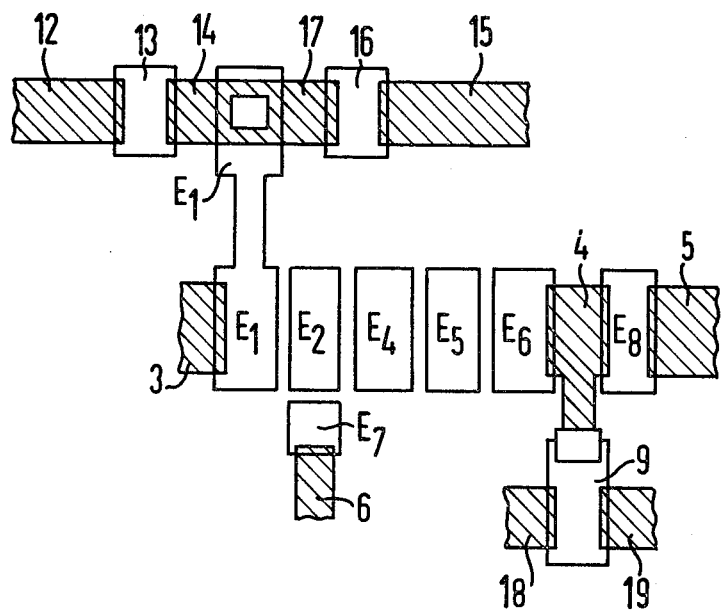

At the time $t_0$, as a result of the connection of the timing pulses $\phi_{T14}$ and $\phi_{E7}$ to the gate electrodes 13 and $E_7$ of the transistors $T_{14}$ and $T_5$, these transistors are switched conductive. The transistor $T_5$ is likewise constructed on the semiconductor substrate 1. Its drain-zone is the zone of the semiconductor substrate lying beneath the electrode $E_2$. The position of its gate electrode $E_7$ and of its source zone 6 can be seen from the view in FIG. 14 showing component arrangement. A residual charge $Q_R$ exists in a potential well beneath the electrode $E_c$, e.g. as a result of a preceding conversion process. The source electrode 6 of the transistor $T_5$ is connected to a voltage $U_6$. This voltage is disconnected at the following time $t_1$ in a timing pulse $\phi_6$. Thus, the potential well located beneath the electrode $E_c$ is charged. At the end of the timing pulse, at the time $t_2$ the voltage $U_6$ is switched on again. The potential well beneath $E_e$ is thus again partially discharged and the surface potential beneath the electrode $E_c$ assumes the value $U_A - U_{ein}$, where $U_{ein}$ is the start voltage of the "transistor" with the gate-electrode $E_1$. Therefore, the potential well beneath the electrode $E_c$ stores the quantity of charge $Q_a$ which corresponds to the analogue signal $U_A$. At the following time $t_3$, as a result of the connection of a timing pulse $\phi_{T14}$ to the gate electrode 16 of the transistor $T_{15}$, a reference potential $\overline{U}_{ref}$ is connected to the electrode $E_1$. Therefore a potential well having a depth of $\overline{U}_{Ref} - U_{ein}$ is formed beneath $E_1$. Thereafter the potential well beneath the electrode $E_c$ is discharged in the same way as already explained making reference to the previously described circuit arrangements. Following a number of N discharge steps, the surface potential beneath the electrode $E_c$ has risen to the value $\overline{U}_{Ref} - U_{ein}$ and no more charge can pass via the potential barrier beneath the electrode $E_1$ to the potential well beneath the electrode $E_2$. FIG. 11 schematically illustrates this last discharge process, which takes place at the time $t_4{}^N$. The contents of the potential well beneath $E_c$ has been transported away in N steps, apart from the residual charge remaining in the well. As a result of the last charge $Q_{tN} < \Delta Q$ to be transported, a small CCD output signal is formed, which is too small to trigger a counter pulse in the evaluator device.

Figure 13:
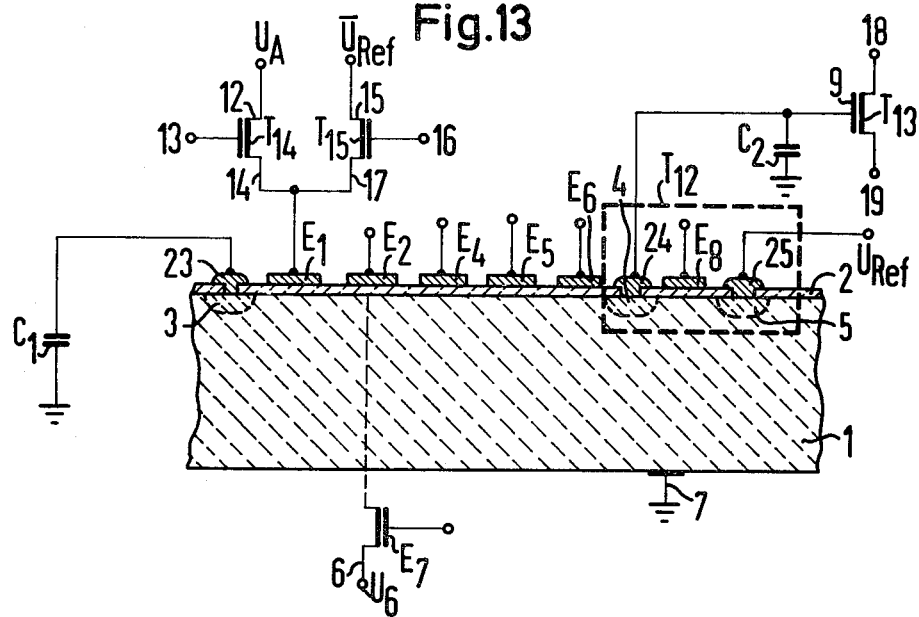
FIGS. 13 and 14 illustrate another embodiment of the invention and the associated arrangement of components.

Instead of a MIS capacitor, a separate capacitor can also be used for accommodating the charge $U_A$ (FIG. 13). In this arrangement, as in the arrangement corresponding to claim 1, charge carriers are introduced into the semiconductor substrate with a first doped zone 3 of the second conductivity type. The lay-out of this arrangement is illustrated in FIG. 14 and shows the arrangement of the gate electrode $E_7$ of the transistor $T_5$ relative to the position of the CCD electrode $E_2$. Such a CCD circuit can be operated with pulse train frequencies of up to 5 MHz. As a small number of CCD electrodes is sufficient for the ADC in accordance with the invention, the transmission losses which otherwise usually limit the use of high pulse train frequencies in CCDs are negligible. At a pulse train frequency of 10 MHz, in addition to a high resolution, a very high conversion speed is also obtained. In an arrangement in accordance with the invention, which, for example, has a MIS capacitor with a capacitance of e.g. 10 pF, and with an analogue signal of e.g. 1 V amplitude, a resolution of $N = 1000$ is achieved for a quantity of charge $\Delta Q = 10^{-14}$ as transported from the CCD. Thus, at a pulse train frequency of 10 MHz, the analogue signal is completely converted into a digital signal after 0.1 msec, maximum.

Figure 15:
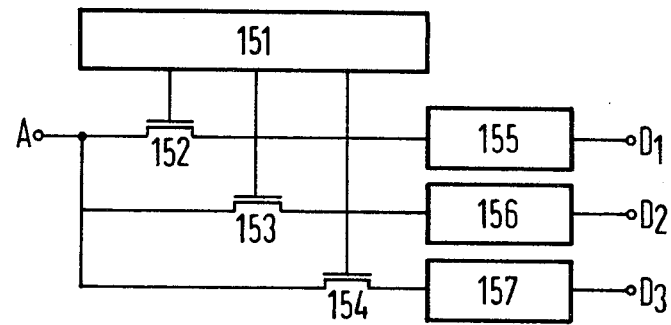
FIG. 15 illustrates an arrangement with three analogue-digital converters in accordance with the invention for multiplex operation.

The known process of multiplex operation can be used for analogue signals whose amplitude changes rapidly within the conversion duration. The analogue-digital converters of the invention are particularly suitable for use in such multiplex circuits. An example of such a multiplex circuit with three ADCs is schematically illustrated in FIG. 15. This consists of a counter which drives selector transistors 152, 153, 154 via which the analogue signal is connected to the individual analogue-digital converters 155, 156, 157 constructed in accordance with the invention. The analogue signal is connected to the terminal A. The outputs are referenced $D_1$, $D_2$, $D_3$. Such a multiplex circuit arrangement can be constructed in integrated fashion on a semiconductor chip. A multiplex circuit arrangement of this type converts the analogue signal into digital form with increasing accuracy the greater the number of analogue digital converters which are fed with the analogue signal. The smallest possible time interval $t_1$ for a scanning process is obtained from the equation $t_1 = t_U/N_{ADC}$ where $N_{ADC}$ is the number of analogue-digital converters contained in the multiplex circuit and $t_U$ is the conversion duration which is required by one individual analogue-digital converter to pass through its entire operating range.

The circuit arrangement can also be used in accordance with the invention inversely, as a digital-analogue converter (DAC), in which case a digital signal represented by a number $N_D$, for example, is converted into an analogue signal, e.g. a voltage $U_{AA}$.

Figure 16:
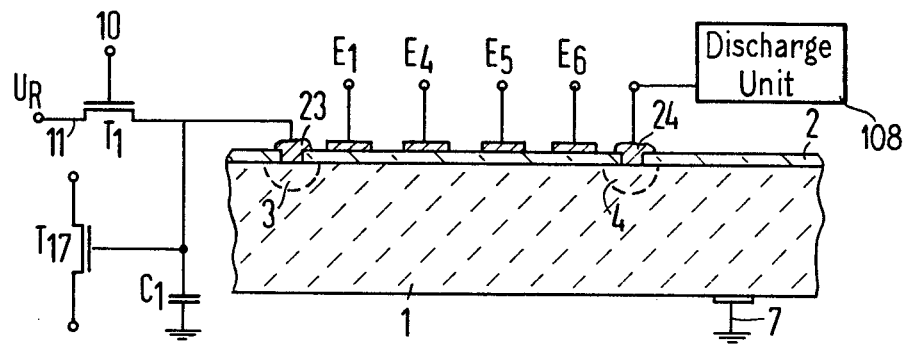
FIGS. 16 and 17 illustrate digital-analogue converters in accordance with the invention.

A circuit arrangement suitable for this purpose using a CCD is schematically illustrated in FIG. 16. The CCD consists, as previously shown in FIG. 3, of a semiconductor substrate 1 of the first conductivity type upon which an insulating layer 2 is applied. Arranged on this insulating layer 2 are a series of electrodes $E_1$, $E_4$, $E_5$ and $E_6$. Also arranged in the semiconductor substrate at both ends of the row of electrodes is, in each case, a first and a second doped zone 3, 4 of second conductivity type, which are provided with metal contacts 23, 24. The first doped zone 3 is connected to a first capacitance $C_1$ and the drain electrode of a first transistor $T_1$. This first transistor is preferably integrated together with the CCD on the same semiconductor chip. The source electrode 11 of this first transistor $T_1$ is connected to a reference voltage source $U_R$. The conversion of a digital signal into an analogue signal can be effected with the aid of such a circuit arrangement in the manner described in the following.

When a pulse train voltage $U_T$ is connected to the gate electrode 10 of the first transistor $T_1$, this transistor is brought into the conductive state and thus the reference potential $U_R$ is connected to the first capacitance $C_1$. When, at the end of the timing pulse the reference voltage $U_R$ is again disconnected from the first capacitance, the connection of various timing pulses to the electrodes $E_1$, $E_4$, $E_5$, $E_6$ causes a fixed quantity of charge $\Delta Q$ to be transported in known manner from the first capacitance $C_1$ to the second doped zone 4 where it is discharged by a discharge unit 108 to the exterior, possibly via a transistor serving as a switch. This withdrawal of charge results in a decreasing change in the voltage across the first capacitance $C_1$. This process is repeated with a frequency corresponding to the number $N_D$ governed by the digital signal. The analogue signal $U_{AA}$ is then governed by the difference between the potential of the electrode connected to the first doped zone (also the first capacitance) and the potential $U_R$ of the reference voltage source. $U_{AA} = U_R + (\Delta Q/C_1) \cdot N_D$, where $U_R$ is the reference voltage which has been connected to the first capacitance before commencement of the conversion process. The decreased voltage which is across the first capacitance $C_1$ at the end of the conversion process can be determined, for example, by means of a transistor $T_{17}$ whose gate electrode is connected to the first capacitance and to the first doped zone 3. A current flowing through this transistor $T_{17}$ is then controlled by the decreased voltage across the first capacitance.

Figure 17:
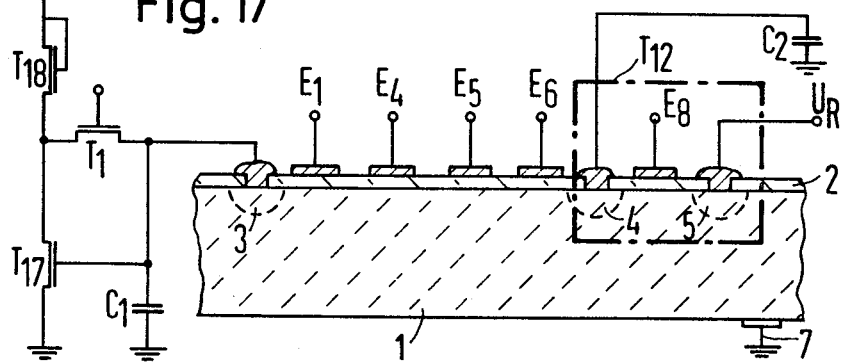

A circuit arrangement corresponding to the invention can also be operated as a digital-analogue converter in an alternative operating mode. This will be explained in the following with reference to FIG. 17.

The doped zone 5, which represents the drain electrode of a transistor $T_{12}$, is connected to a reference voltage source $U_R$. As a result of the connection of a timing pulse to the gate electrode $E_8$, this transistor $T_{12}$ is switched conductive and thus the reference voltage $U_R$ is connected to the second doped zone 4. At the same time the second capacitance $C_2$, which is formed from the parasitic capacitance of the second doped zone and the supply lines connected to this zone, is brought to a charge state which is dependent upon the value of the reference voltage $U_R$. At the end of the timing pulse, the transistor $T_{12}$ is again switched non-conductive and the second capacitance $C_2$ is cut off from the reference voltage source.

As a result of the connection of timing pulses in known manner to the electrodes $E_6$, $E_5$, $E_4$ and $E_1$, a fixed quantity of charge $\Delta Q$ is transported out of the second capacitance $C_2$ into the first capacitance $C_1$ and the second capacitance $C_2$ is reconnected to the reference voltage source $U_R$ by connecting a timing pulse to the electrode $E_8$ of the transistor $T_{12}$. A quantity of charge $\Delta Q$ is again transported into the first capacitance. This process is repeated overall with a frequency in accordance with the digital number $N_D$ corresponding to the digital signal. The analogue signal is then determined by the value of the quantity of charge contained in the first capacitance and thus by the voltage falling across this first capacitance.

As already mentioned above, the first doped zone is connected to a read-out circuit which, in addition to the transistor $T_1$, has two further transistors $T_{17}$ and $T_{18}$ which are connected to one another in series with transistor $T_{17}$ having its gate electrode tied to its source electrode. The drain of transistor $T_1$ is connected to the junction of transistor $T_{17}$ and $T_{18}$. The drain electrode of transistor $T_{17}$ is grounded.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A circuit arrangement for converting an analogue signal into a digital signal, said circuit arrangement comprising:

(a) a first capacitance;
(b) a second capacitance which is smaller than the first capacitance;
(c) a first device means connected between the first and second capacitances for providing a stepped exchange of charge between the first and second capacities;
(d) a second device means for bringing the second capacitance to a given charge state;
(e) an evaluation device means for evaluating the charge state of the second capacitance;
(f) a counting device means for counting each stepped exchange of charge to provide said digital signal;
(g) said first device means for stepped exchange of charge comprising a charge coupled device (CCD) means for transferring accurately controlled and substantially equal amounts of charge for the stepped exchanges substantially independent of the charge on the first capacitance;
(h) said CCD means comprising a semiconductor substrate of a first conductivity type which is provided with a substrate terminal, an insulating layer arranged on the semiconductor substrate, at least four electrodes arranged in series as a row of electrodes comprising electrically conductive material arranged on said insulating layer, a first zone of second conductivity type in the semiconductor substrate at one end of the row of electrodes, and a second doped zone of second conductivity type at the other end of the row of electrodes; and
(i) said second device means comprising an MIS field effect transistor whose source zone is said second doped zone and whose drain zone is a third doped zone of second conductivity type in the semiconductor substrate, a fifth electrode on said insulating layer being provided between the second and third doped zones.

2. A circuit arrangement as claimed in claim 1, characterized in that the second capacitance is formed from capacitances formed by the second doped zone together with the supply lines connected to this zone and the substrate terminal.

3. A circuit arrangement for converting an analogue signal into a digital signal, said circuit arrangement comprising:

(a) a first capacitance;
(b) a second capacitance which is smaller than the first capacitance;
(c) a first device means connected between the first and second capacitances for providing a stepped exchange of charge between the first and second capacitances;
(d) a second device means for bringing the second capacitance to a given charge state;
(e) an evaluation device means for evaluating the charge state of the second capacitance;
(f) a counting device means for counting each stepped exchange of charge to provide said digital signal;
(g) said first device means for stepped exchange of charge comprising a charge coupled device (CCD) means for transferring accurately controlled and substantially equal amounts of charge for the stepped exchanges substantially independent of the charge on the first capacitance; and
(h) the charge-coupled device means having a semiconductor substrate of a first conductivity type which is provided with a substrate terminal, an insulating layer arranged on the semiconductor substrate, at least five electrodes arranged in series as a row of electrodes, one further electrode arranged on the insulating layer, a doped zone of second conductivity type next to said further electrode, a second doped zone of second conductivity type between one end of the row of electrodes and said further electrode, a first of said five electrodes being connected to drain electrodes of two field effect transistors, a source electrode of one of said two field effect transistors being connected to the analogue signal and a source electrode of the other field effect transistor being connected to a reference voltage.

4. A circuit arrangement as claimed in claim 3, characterized in that adjacent the first electrode in line with said row of electrodes is arranged a doped zone of second conductivity type which is connected to an electrode of said first capacitance.

5. A circuit arrangement for converting an analogue signal into a digital signal, said circuit arrangement comprising:
(a) a first capacitance;
(b) a second capacitance which is smaller than the first capacitance;
(c) a first device means connected between the first and second capacitances for providing a stepped exchange of charge between the first and second capacitances;
(d) a second device means for bringing the second capacitance to a given charge state;
(e) an evaluation device means for evaluating the charge state of the second capacitance;
(f) a counting device means for counting each stepped exchange of charge to provide said digital signal;
(g) said first device means for stepped exchange of charge comprising a charge coupled device (CCD) means for transferring accurately controlled and substantially equal amounts of charge for the stepped exchange substantially independent of the charge on the first capacitance;
(h) said charge coupled device means comprising a semiconductor substrate of a first conductivity type having first and second diffusion zones of second conductivity type therein and a row of electrodes therebetween arranged on an insulating layer over the substrates, a third diffusion zone of second conductivity type being separated from the second diffusion zone by an additional electrode; and
(i) the first capacitance comprising a MIS (metal-insulator-semiconductor) capacitor which is constructed together with the CCD means on the same semiconductor substrate between the first and second diffusion zones.

6. A circuit arrangement as claimed in claim 5, characterized in that said MIS capacitor has a metal electrode arranged at a distance of less than 5 $\mu$m from one of the electrodes of said row of electrodes.

* * * * *